Oct. 8, 1957 R. L. SHERWOOD 2,809,332

POWER SEMICONDUCTOR DEVICES

Filed July 29, 1953

INVENTOR.

Ralph L. Sherwood

BY J. L. Whittaker

ATTORNEY 2,809,332
Patented Oct. 8, 1957

2,809,332

POWER SEMICONDUCTOR DEVICES

Ralph L. Sherwood, New Brunswick, N. J., assignor to Radio Corporation of America, a corporation of Delaware Application July 29, 1953, Serial No. 370,964

10 Claims. (Cl. 317—235)

This invention relates to semiconductor devices and to methods of preparing them and particularly to an improved construction for P-N junction-type semiconductor devices used in power applications.

A typical P-N junction-type semiconductor device comprises a body of semiconductor material of one type of conductivity having one or more P-N junctions formed therein. The P-N junctions comprise zones of N-type and P-type conductivity material separated by rectifying barriers which have high resistance to electrical current flow in one direction and low resistance to such flow in the reverse direction.

One type of semiconductor device to which the principles of the invention apply is known as a transistor and may include a body of semiconductor material of one type of conductivity having two P-N junctions with the various regions of the device arranged in P-N-P or N-P-N order. In such devices, one of the two outer regions of the same type of conductivity is operated as the emitter electrode and the other is operated as the collector electrode. An ohmic contact electrode is bonded to the third or middle region which constitutes the base region of the device. In operation of such devices, under the control of the base electrode, the emitter electrode injects minority charge carriers into the base region. These carriers are collected by the collector electrode which is the output electrode of the device to which a suitable output circuit is connected.

As occurs in conventional electronic devices, the passage or flow of electrical charges in semiconductor devices such as transistors produces heating of the devices. The problem of dissipation of the generated heat is particularly important in the operation of transistors required to handle considerable amounts of power.

Heretofore, one solution of the problem of heat dissipation has been to immerse the semiconductor device in a metallic container filled with an oil. However, the conventional oils generally utilized for such a purpose have been unsatisfactory for several reasons. First, for the quantity of oil used, the viscosity of the substance has been too high to achieve the desired heat dissipation. Secondly, it has been found that the leakage current has been high in the operation of the transistors mounted in oil-filled containers. In transistors, under normal operating conditions, current flows in certain desired directions to or from the emitter and collector electrodes. Leakage current is defined as the current which flows in a direction opposite to the desired direction with respect to each electrode. Under ideal conditions, leakage current is zero. However, the ideal conditions are, in general, not obtainable and with conventional oil-cooled transistors the leakage current may be undesirably high.

Another problem encountered in manufacturing power transistors, and particularly in mounting junction type devices, is that of making a good electrical connection between tne collector electrode and the metallic heat radiating member without raising the temperature to an extent that the collector P-N junction is harmed. P-N junctions are adversely affected by temperatures not very far above the upper limit of their intended operating range. This adverse effect of heat on the P-N junctions is one of the principal reasons for taking special precautions to rapidly dissipate the heat generated during the normal operation of a power transistor.

Previously, the problem of making an electrical connection between the collector electrode and the heat radiator has been solved in several ways. According to one method, a low melting point solder such as Woods Metal or Cerrobend has been employed. However, even such solders melt at an undesirably high temperature for the purposes of this invention. According to another method, a liquid solder comprising a mixture of indium and mercury has been employed. Since the solder is a liquid, there is danger that the mercury may flow and adversely affect the junction, for example, as by short circuiting it to the body of the transistor. Another defect of the latter method is that indium, a P-type impurity, when used in conjunction with an N-P-N transistor, might adversely affect the characteristics of one of the N-type regions.

Accordingly, an important object of this invention is to provide an improved semiconductor device suitable for power operation.

Still another object of the invention is to provide an improved P-N junction type semiconductor device having good heat dissipation characteristics and improved operational characteristics.

A further object of the invention is to provide an improved method of preparing a transistor.

Another object of the invention is to provide an improved method of mounting a transistor in a metal housing.

A still further object is to provide an improved method of making electrical connection between a portion of a transistor and a metal heat radiator.

In general, the principles and objects of this invention are accomplished by preparing a semiconductor crystal and its associated electrodes to form a transistor. The entire transistor, except for portions of each electrode, is provided with an insulating coating. The transistor is then mounted in a metallic housing with one of the junction electrodes preferably the collector, in electrical contact therewith. Such connection is made to the housing by means of an electrically conducting and heat conducting plastic or resinous material which bonds the transistor rigidly to the housing and thereby also provides support therefor. The remainder of the housing is filled with a suitable heat conducting potting material.

The invention is described in greater detail by reference to the drawing wherein.

Similar elements are designated by similar reference characters throughout the drawing.

Figure 1:
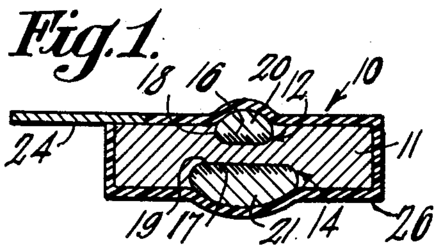
Fig. 1 is a sectional, elevational view of a transistor at an early stage of the method of manufacture in accordance with the present invention.

The principles of this invention are particularly applicable to P-N junction type semiconductor devices, for example transistors. A typical junction type transistor 10 is shown in Figure 1 and comprises a crystal or wafer 11 of semiconductor material of germanium, silicon or the like of N-type or P-type conductivity. The wafer or body 11 is provided with a P-N junction-type emitter electrode 12 and a P-N junction-type collector electrode 14. When prepared by an alloying technique to be described below, the electrodes 12 and 14 include regions 16 and 17 of a type of conductivity opposite to that of the semiconductor body 11 and separated from the body by rectifying barriers 18 and 19 respectively. Portions 20 and 21 adjacent to the regions 16 and 17 comprise alloys of the material of the body 10 and the material employed in forming the P-N junctions. A base electrode 24 is mounted in ohmic contact with the body 11, preferably at one end thereof. The base electrode 24 is preferably a nickel plate or tab.

The emitter and collector electrodes 12 and 14 are preferably formed in opposite surfaces of the crystal or wafer 11 and are concentrically aligned. The collector electrode 14 may be made larger than the emitter electrode 12 according to the teaching of J. I. Pantchechnikoff in his copending U. S. patent application, Serial Number 293,586, filed June 13, 1952 and assigned to the assignee of this application, now abandoned.

One satisfactory method for forming the junction electrodes 12 and 14 is described in a copending U. S. patent application of Charles W. Mueller, Serial Number 295,304, filed June 24, 1952 and assigned to the assignee of this application. According to the method described in said application, disks or pellets of a so-called impurity material are placed in contact with opposite surfaces of the block 11 of semiconductor material. The assembly of block and pellets is heated in an atmosphere of hydrogen, or an inert gas such as argon. The heating is effected at a temperature sufficient to cause the pellets to melt and alloy with the semiconductor block to form the desired junction electrodes. If the body of the device comprises N-type semiconductor material, then any one of indium, gallium, aluminum, zinc or boron, for example, may be used as the impurity material. If the semiconductor body is of P-type material, then any one of phosphorus, arsenic, sulfur, selenium, tellurium, antimony or bismuth, for example, may be used as the impurity material. After the alloying operation, the device is etched in conventional fashion.

For the purposes of the following description, the transistor 10 will be described as a P-N-P transistor including a crystal 11 of N-type germanium having P-type regions 16 and 17.

Figure 2:
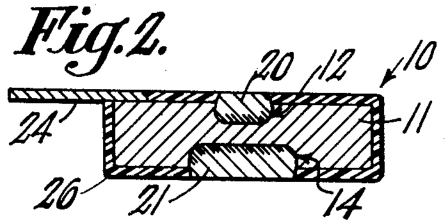
Fig. 2 is a sectional, elevational view of the device of Fig. 1 at a later stage in the method of manufacture.
Figure 3:
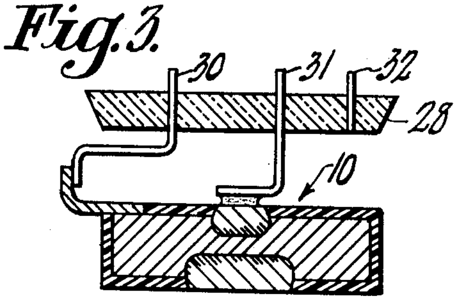
Fig. 3 is a sectional, elevational view of the device of Fig. 1 at another stage in the method of manufacture.

Next, according to the invention, a thin coating 26 of an insulating material, for example coil dope which comprises a solution of polystyrene in toluol, is applied over the entire device except for at least a portion of the base electrode 24. This is permitted to dry by evaporation of the organic solvent. Next, referring to Figure 2, the portions 20, 21 of the P-N junction electrodes 12 and 14, respectively, are treated to provide a suitable surface for making electrical connection thereto. Such treatment may comprise grinding down the portions 20 and 21 to provide a flat connecting area from which the insulating coating has been removed. To support and space the transistor electrode leads, an insulating member 28 carrying electrode leads may be provided as shown in Figure 3. Preferably, electrode lead support 28 consists of a flat plate of glass or the like which may have a tapered edge. A plurality of stiff metal conductors or leads 30, 31 and 32 extend through the support 28 in spaced relation. Conductors 30, 31 and 32 may, for example, comprise stiff wires which may have a diameter of the order of 20 mils, for example, of copper or any other metal to which the glass will bond in airtight engagement.

The leads 30, 31 and 32 are utilized for making electrical connection to selected electrodes of the transistor 10. One lead, e. g. 30, is bonded to the base electrode 24 in any convenient fashion, for example, by welding. Another lead 31 which is intended for connection to the portion 20 of the emitter electrode 12 is preferably first bent at its end and the bent portion is bonded to the portion 20 by means of a low-melting soldering material such as Cerrobend, Woods metal or the like. Cerrobend is a solder material containing 50% bismuth, 26.7% lead, 13.3% tin, and 10% cadmium. The lead 32 provides electrical connection to the collector electrode 14 but the connection is made at a later stage in the method.

Figures 4, 5:
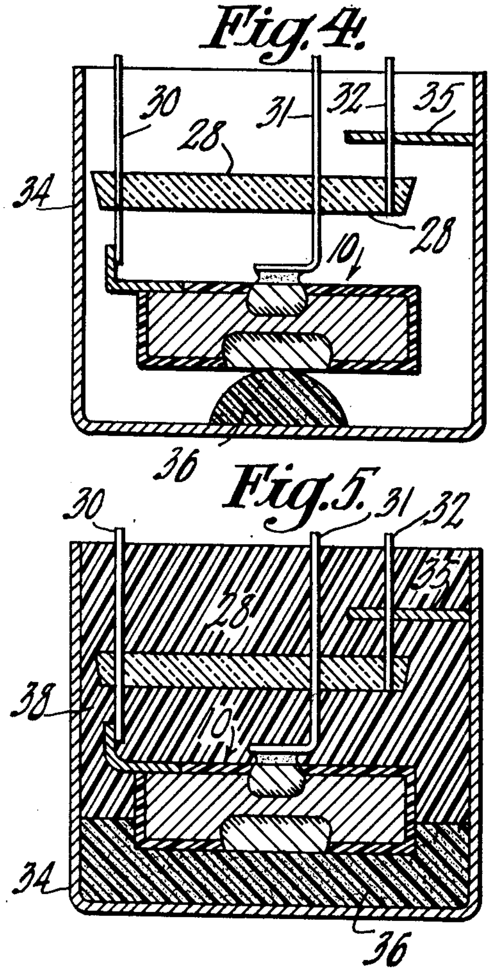
Fig. 4 is a sectional, elevational view of the device of Fig. 1 at still another stage in the method of manufacture.
Fig. 5 is a sectional, elevational view of a completed device prepared according to the principles of the invention; and, Fig. 6 is a sectional, elevational view of a completed device according to a modification of the invention.

Next, referring to Figure 4, a heat radiator in the form of a metal housing 34 of copper, nickel or the like is prepared to receive the transistor 10. The housing is provided with a metal pin 35 which extends inwardly from the inner wall thereof and which is intended to contact the electrical lead 32 through which connection is made for the collector electrode. A quantity 36 of a heat conductive and electrically conductive resinous or plastic material is placed at some predetermined position on the inner surface of the closed end of the metal housing. This material is intended to provide support for the transistor and electrical and thermal contact to the heat radiating housing.

The material may be substantially any resin or plastic which hardens at relatively low temperatures, i. e., from about room temperature to about 75° C. One such material may be selected from a sub-class of resins which are manufactured by Ciba Company, Inc. under the tradename "Araldite." The mechanical and chemical properties of Araldite have been described, for example, in a paper by Preiswerk, Meyerhans and Denz, which appears in "Materials and Methods" October, 1949, and by Preiswerk and Meyerhans in "Electrical Manufacturing" July 1949. Further information on the chemical composition of Araldite will be found in a paper by Ott which appears in "Schweizer Archiv" January 1949, pages 23–31 (a translation of this paper has been published by The Technical Service Department, Aero Research Limited, Duxford, Cambridge, England, which is entitled "Aero Research Technical Notes," Bulletin No. 75, March 1949). In this connection reference is made to the Patents 2,324,483 and 2,444,333 to Castan which disclose examples of Araldite resins.

Suitable araldite resins for use in this invention are of the ethoxyline class of materials and are condensation products of polyaryl-ethylene oxide compounds with acid anhydrides, amines and other compounds. All of these materials harden to form solid materials without evolution of water or other volatile substances. A particular preferred example for use in the present invention has the designation Araldite CN502.

In preparing the conductive medium, a quantity of the selected resin powder is dissolved in a suitable alkyl amine hardener, preferably one of the lower alkyl amines, and a quantity of a metallic powder is dispersed therein. The powder may comprise unoxidized silver, nickel, copper or the like, preferably in the form of thin, flat, rectangular platelets present in the mixture in an amount varying from 45% to 80% by weight. The mixture is thus fluid at room temperature and remains so for a time of the order of several hours which is sufficient for assembly of the component parts of the device.

Next, referring to Figures 4 and 5, the transistor 10 is inserted into the housing 34 with the collector electrode 14 down until the electrode comes into contact with the quantity 36 of conductive material. The transistor is positioned with the lead 32 in contact with the pin 35 and is pressed into the material 36 until the conductive substance spreads out and covers the lower surface thereof and portions of each end of the transistor and forms a first embedding matrix therefor. This first matrix provides rigid support for the transistor when it polymerizes and hardens after a period of several hours. The hardened resin also provides thermal and electrical connection of the collector electrode to the housing 34 which is a heat radiator. Since the material 36 is electrically conductive, it must not contact the base electrode 24 or emitter electrode 12 or the conductive support rods 30 and 31. The lead 32 is then welded or soldered to the pin 35 and the remainder of the housing 34 is filled with heat conducting, electrically insulating material 38. Such a substance may comprise a thermosetting Araldite resin having oxidized nickel powder or the like material dispersed therein. The material 38 provides a second matrix for embedding the portions of the transistor not surrounded by the material 36. The materials 36 and 38 unite, substantially, to form a unitary embedding medium for the transistor.

Figure 6:
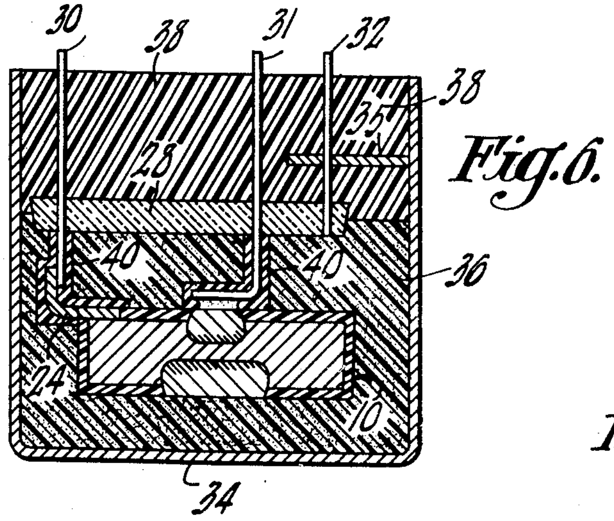

In an alternative construction, referring to Figure 6, the portions of the rods 30 and 31 between the glass base 28 and the transistor 10, the base electrode 24, and all other exposed conductive elements are coated with insulating material 40. Thus, the electrically conductive resin 36 may be employed to fill the housing 34 substantially up to the glass base 28. The remainder of the housing may be filled with a conventional insulating resin or electrically insulating, heat conducting plastic.

What is claimed is:

1. A semiconductor device comprising a body of semiconductor material, emitter and collector and base electrodes mounted in operative relation with said body, a first quantity of heat-conducting and electrically-conducting material surrounding and embedding a portion of said body and making electrical contact with one of said electrodes, said body being insulated from said first quantity of material, another quantity of heat-conducting, electrically-insulating material surrounding and embedding the remainder of said body and said electrodes, said quantities of material comprising a unitary embedding medium.

2. A semiconductor device comprising a body of semiconductor material, emitter, collector and base electrodes mounted in operative relation with said body, a first quantity of heat conducting and electrically conducting material surrounding and embedding a portion of said body and making electrical contact with said collector electrode, said body being insulated from said first quantity of material, another quantity of heat conducting electrically insulating material surrounding and embedding the remainder of said body and said electrodes, said quantities of material comprising a unitary embedding medium.

3. The device described in claim 2 including a metallic housing surrounding said medium.

4. The device described in claim 2 including a metallic housing surrounding said medium, said first quantity of electrically conducting material making electrical and heat transmitting contact between said one of said electrodes and said housing.

5. A semiconductor device comprising a body of semiconductor material having a plurality of P-N junction electrodes formed therein, a layer of insulating material covering said body except for a portion of the material associated with each of said junctions whereby electrical connection may be made thereto, an ohmic contact electrode connected to said body, a first matrix of thermally and electrically conducting material surrounding and embedding a portion of one of said P-N junctions and a portion of said insulated body, a second matrix of thermally conducting electrically insulating material surrounding the remainder of said body and said electrodes and forming with said first matrix a unitary embedding medium.

6. The device set forth in claim 5 including a metallic housing surrounding said medium.

7. A semiconductor device comprising a body of semiconductor material having emitter and collector P-N junction electrodes formed therein, a layer of insulating material covering said body except for a portion of the material associated with each of said junctions whereby electrical connection may be made thereto, an ohmic contact electrode connected to said body, electrical connections to said ohmic contact electrode and said portions of material associated with each junction, a first matrix of thermally and electrically conducting material surrounding and embedding a portion of said collector P-N junction and a portion of said insulated body, a second matrix of thermally conducting electrically insulating material surrounding the remainder of said body and said emitter and base electrodes and forming with said first matrix a unitary embedding medium.

8. A semiconductor device comprising a body of semiconductor material, a P-N junction electrode within said body, a metallic heat radiating member at least partially surrounding said body, and means forming an electrically and thermally conducting bond between a portion of said electrode and said heat radiating member, said bonding means comprising a plastic material having metallic particles dispersed therein.

9. A semiconductor device comprising a body of semiconductor material, a plurality of electrodes on said body, a metallic heat radiator at least partially surrounding said body and bonded to a portion thereof by means of a heat conductive bonding material, said bonding material comprising a plastic medium having a quantity of metallic particles dispersed therein, said metallic particles comprising between 45 and 80% by weight of said plastic medium.

10. A semiconductor device comprising a body of semiconductor material, a P-N junction electrode within said body, a metallic heat radiating member at least partially surrounding said body, and means for forming an electrically and thermally conducting bond between said electrode and said heat radiating member, said bonding means comprising a plastic material having metallic particles in the form of flat rectangular platelets dispersed therein, said plastic material comprises a synthetic resin capable of hardening at a temperature substantially that of ordinary room temperature.

References Cited in the file of this patent

UNITED STATES PATENTS

| | | |
|---|---|---|
| 2,406,405 | Salisbury | Aug. 27, 1946 |
| 2,572,801 | Casellini | Oct. 23, 1951 |
| 2,606,960 | Little | Aug. 12, 1952 |
| 2,672,528 | Shockley | Mar. 16, 1954 |
| 2,735,050 | Armstrong | Feb. 14, 1956 |
| 2,758,261 | Armstrong et al. | Aug. 7, 1956 |

FOREIGN PATENTS

| | | |
|---|---|---|
| 175,239 | Great Britain | Nov. 16, 1922 |